United States Patent [19]

Straayer

[11] Patent Number: 4,851,656

[45] Date of Patent: Jul. 25, 1989

[54] METHOD AND APPARATUS FOR ENHANCING OPTICAL PHOTOPLOTTER ACCURACY

[75] Inventor: Ronald J. Straayer, South Windsor, Conn.

[73] Assignee: The Gerber Scientific Instrument Company, South Windsor, Conn.

[21] Appl. No.: 142,725

[22] Filed: Jan. 11, 1988

[51] Int. Cl.[4] .............................................. G03B 41/00
[52] U.S. Cl. ....................................... 250/201; 354/4; 356/358
[58] Field of Search ........................ 250/201, 202, 205; 354/4; 356/358

[56] References Cited

U.S. PATENT DOCUMENTS 4,500,182  2/1985  Schumann ................................ 354/4
4,589,746  5/1986  Pavone ..................................... 354/4

Primary Examiner—Edward P. Westin
Attorney, Agent, or Firm—McCormick, Paulding & Huber

[57] ABSTRACT

A novel method and apparatus for improving the overall accuracy and repeatability of an optical photoplotter which is characterized by a controller which determines an image position error from interferometric feedback signals and position command signals and subsequently provides displacement of the image in dependence thereon.

13 Claims, 2 Drawing Sheets

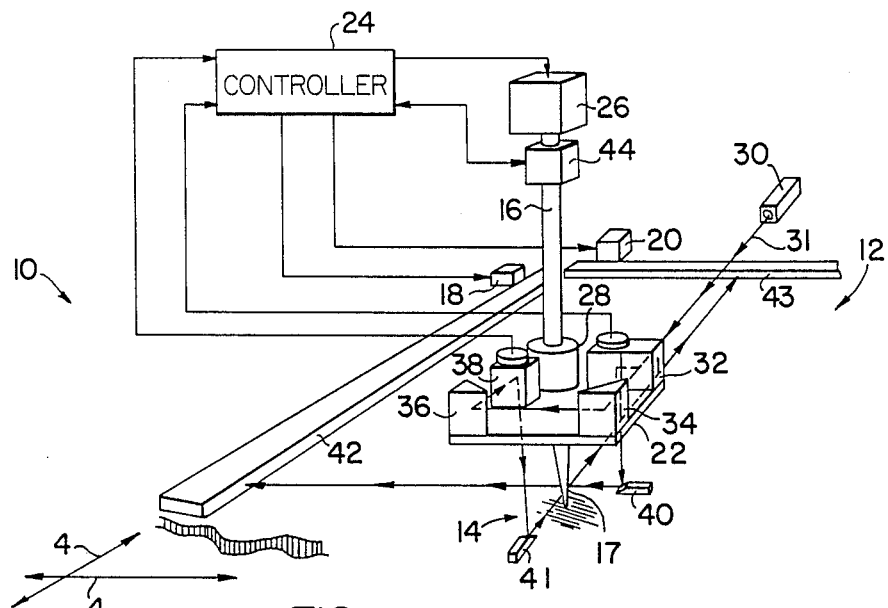
FIG. 1
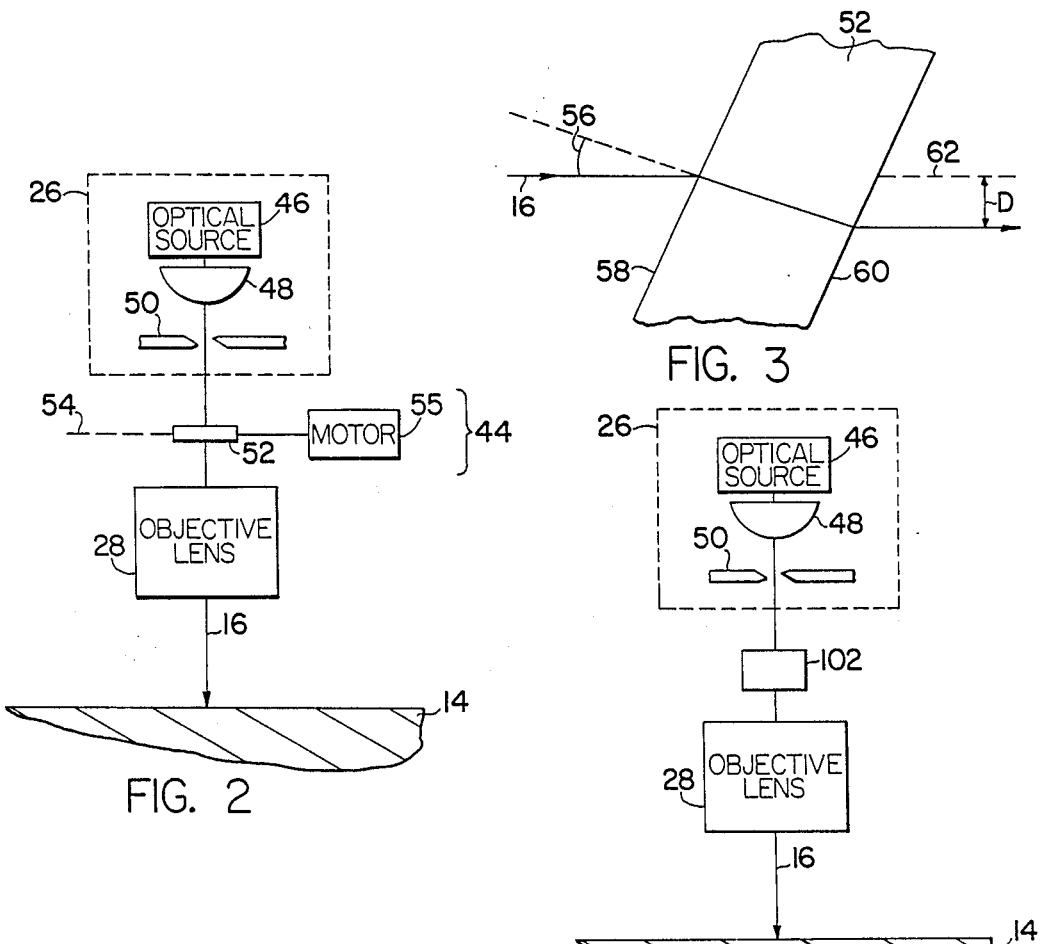
FIG. 2
FIG. 3
FIG. 5

METHOD AND APPARATUS FOR ENHANCING OPTICAL PHOTOPLOTTER ACCURACY

TECHNICAL FIELD

This invention relates to optical plotter control systems and more particularly to photoplotter position feedback systems that optically compensate for optical beam position error.

BACKGROUND OF THE INVENTION

High accuracy photoplotting systems are well known in the art. These systems generate precision phototools which are used for semi-conductor masks, television arrays and for printed circuit boards (PCB) to write printed circuit board artwork onto a film emulsion. A typical photoplotter system, such as is marketed by the Gerber Scientific Instrument Company, consists of a magnetic tape drive, hard disk, computer, interactive graphics terminal, image processor, optical table having a moveable write platen for positioning the substrate, and a precision optical exposure device. The photoplotter system also includes a two-dimensional media carriage, a two-dimensional feedback interferometer, and electronics as is necessary to convert computer aided design (CAD) data to PCB artwork.

The optical scan and exposure system includes an optical exposure head (OEH). The optical table has a controller that employs a feedback position monitor, such as a laser interferometer, which continuously tracks the write platen position relative to the exposure head. The accuracy of the feedback position monitor is usually significantly greater than the platen positioning accuracy or that of the exposure head. For example, a Gerber 1434 direct imaging system has an accuracy of approximately 30 to 40 micro-inches and a Gerber 3235 direct imaging system has an accuracy of approximately 200 micro-inches. In contrast, a feedback position monitor often used with those systems (e.g., a Hewlett Packard interferometer) can have an accuracy of less than 1 micro-inch. Therefore, the performance of the table positioning mechanisms are limited by the mechanical component and servo system inaccuracies. These inaccuracies ultimately limit the overall performance of the photoplotter system.

It would be advantageous to have a method and apparatus for enhancing the accuracy of photoplotter systems by optically compensating for mechanical accuracy limitations. The present invention is drawn toward such a method and apparatus.

SUMMARY OF THE INVENTION

An object of the present invention is to provide a method and apparatus which optically compensates for the accuracy limitations of mechanical components in an optical photoplotter.

According to the present invention an apparatus compensating for displacement error from a commanded position of an optical beam incident on a displaceable optical table forming an image includes a means for providing optical beam feedback indicative of the image position on the table surface. A controller compares the measured and commanded image positions to determine the displacement error. An optical compensator receives signals from the controller to optically displace the image along the table surface to remove the displacement error.

According to another aspect of the present invention a system in an optical photoplotter for positioning an image formed by optical beam incident on an optical table surface includes an addressable optical exposure head which selectively outputs the optical beam. Feedback apparatus provides signals which indicate the position of the image on the table surface. A mechanism is included for displacing the optical table in response to position command signals. An addressable compensator optically displaces the image along the table surface in response to received control signals. A controller determines the position of the optical beam on the table surface from the optical beam feedback signals, compares the measured and commanded optical beam positions and generates therefrom the optical compensator control signals.

BRIEF DESCRIPTION OF THE DRAWINGS

FIG. 1 is a simplified schematic drawing of a portion of an optical photoplotter having a compensation apparatus provided according to the present invention.

FIG. 2 is a simplified schematic illustration of a portion of the optical components found in the photoplotter of FIG. 1.

FIG. 3 is a simplified drawing illustrating displacement of an optical beam by the compensation apparatus of FIG. 1.

FIG. 5 is a simplified block diagram partially illustrating a compensation means alternative to that shown in FIG. 1.

DESCRIPTION OF THE PREFERRED EMBODIMENT

Figure 4:
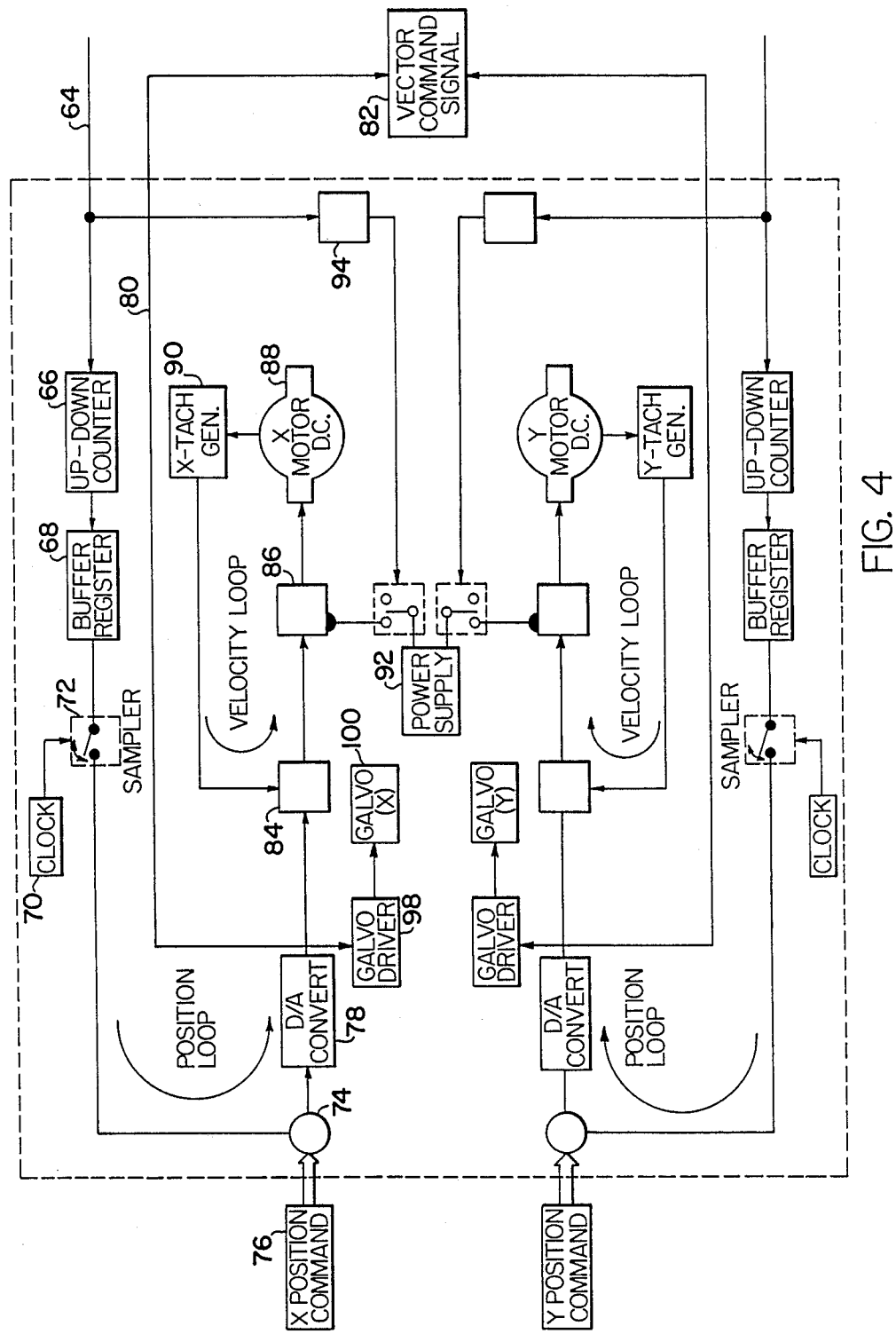
FIG. 4 is a simplified block diagram partially illustrating the operation of a controller used with the photoplotter of FIG. 1.

Referring now to FIG. 1 there is illustrated in a simplified schematic form a portion of an optical photoplotter 10. The photoplotter includes a write platen 12 which receives a glass or film substrate 14 which is precisely positioned on the write platen so that an optically sensitive media (emulsion) receives an optical beam 16 forming an image 17 thereon. The optical table is displaceable in substantially perpendicular directions (X, Y) by respective motors 18 and 20 which drive conventional ball screws (not shown) to displace the write platen in each of the X and Y directions.

The photoplotter also includes an interferometer 22 which provides signals to controller 24 indicative of the position of the image relative to each axis. As is conventional, an exposure head 26, which may include a means for generating the optical beam, is fixedly positioned relative to an objective lens 28 which focuses the beam onto the substrate surface. The optical exposure head (OEH) is conventional, as is the objective lens. The feedback interferometer includes a laser 30 that provides a beam 31 to a beam splitter 32 which splits the beam 31. Each beam is provided to a plurality of mirrors, such as mirrors 34,36 and 38 which further provide the beam down to the optical table surface, where the beams are received by X and Y turning mirrors 40,41 respectively. Each measurement beam is incident on precisely flat mirrors 42,43 aligned with a respective displacement axis. The flat mirrors reflect the beams along the optical path where the relative axial displacement can be determined interferometrically.

The controller 24 computes, in a conventional manner, the position of the optical beam on the surface of the optical table, and provides signals to a shutter mechanism within the optical exposure head to selectively expose the substrate. The controller provides position command signals to motors 18 and 20 in conjunction with the control signals to the shutter mechanism to generate the desired substrate pattern.

In addition, the photoplotter of FIG. 1 also comprises an optical compensation apparatus 44 which optically provides a small displacement in both the X and Y directions to compensate for errors in the command position of the optical beam. It is well known even though the feedback interferometers can monitor write platen position with great precision (e.g. less than one micro-inch for each axis), the accuracy of the photoplotter is usually substantially less. The difference in accuracy can be as large as a factor of 10 (approximately 10 micro-inches for the above example). Mechanical and servo control systems are usually responsible for the loss of precision.

In order to improve the overall photoplotter accuracy, the optical compensation apparatus 44 is located in the path of the optical beam 16 to provide a displacement of the plotted image. As detailed hereinafter, a photoplotter control system determines the exact position of the optical table and compares this position with the commanded position. If an error is found between the commanded and measured positions of the beam 16 on the substrate, the controller generates signals which displace the image and remove the positional error.

FIG. 2 is a simplified schematic illustration of a portion of the optics used in the photoplotter of FIG. 1. The optical exposure head 26 of FIG. 1 comprises an optical source 46 in the preferred embodiment that provides the beam 16 to a condenser lens 48. The optical beam then traverses a conventional shutter mechanism 50, which is addressable and selectively outputs the beam from the optical exposure head (OEH). The beam 16 is received by optical compensation apparatus 44 which preferably includes tilting plate 52 that is rotatable about axis 54 by an addressable motor 55. The tilting plate in the preferred embodiment comprises glass or an equivalent optically transparent material. As detailed hereinafter, the amount of rotation of the tilting plate 52 about the axis 54 determines the amount of displacement of the optical beam. The tilting plate in FIG. 2 will displace the beam 16 in a direction perpendicular to both the optical beam and axis 54. Although only one tilting plate and motor is shown in FIG. 2, a second tilting plate oriented approximately 90 degrees from tilting plate 52 is necessary to provide displacement in the orthogonal direction. Other means of displacing the image include moveable aperture planes (102, fig.5), and displaceable objective lenses. After exiting the tilting plate, the optical beam then traverses objective lens 28, and a focused beam impinges upon the surface of the substrate.

FIG. 3 is a simplified, sectioned illustration schematically showing a portion of the tilting plate 52 of FIG. 3. The optical beam 16 incident at an angle 56 onto the surface of the tilting plate and is difracted as it passes therethrough in accordance with Snell's Law. Assuming surfaces 58 and 60 of the tilting plate are nominally parallel, the optical beam will be displaced by an amount, D, given by:

where $D = t \sin I \left[ 1 - \left( \frac{1 - \sin^2 I}{N^2 - \sin^2 I} \right) 1/2 \right]$ For small angles the displacement can be simplified to $$\approx t \frac{I}{N} (n - 1)$$

In the preferred embodiment, the tilting plate is located in an imaging system on the input side of the imaging lens (the object conjugate). Consequently the path of the beam will be laterally displaced by the distance D from the path 62 along which it would traverse if the plate surfaces 58, 60 were located with zero degree tilt (i.e. normal to the incident beam). On the substrate, the beam will be displaced by D M, where M is the system magnification. In the photoplotter of FIG. 1, the objective lens provides a reduction in magnification (M=0.10) so the effect the tilt plate is reduced. If the range of tilt of the plate is kept small and the thickness is correspondingly small, then the effect of optical aberrations are minimized. As indicated above, the optical compensation apparatus of FIG. 1 includes two tilt plates and corresponding motors aligned at 90° to allow for independent X and Y displacement compensation. In the preferred embodiment the motors comprise a conventional galvanometer and the objective lens can be one of a number of conventional, high resolution objective lenses.

A portion of controller 24 is illustrated in FIG. 4. The controller 24 incorporates a number of well known components which are used in optical photoplotters to perform well known photoplotting functions detailed above and are therefore not shown for purposes of clarity. Preferably, the controller is responsible for real time control of all of the photoplotter functions. The preferred controller is symmetrically configured such that the same functions are performed for both the X and Y axes of displacement. Although components for both X and Y axes are shown in FIG. 4, only the components associated with the X axis optical compensation are described hereinafter.

Referring now to FIG. 4, feedback signals from the laser interferometer 34 is received on lines 64, provided to up-down counter 66 and then to buffer register 68. A conventional clock 70 periodically samples the contents of the buffer register (block 72) and generates signals indicative of the write platen position to a comparator 74. The measured position of the optical table is compared with digital position command signals, 76. The difference signal is output to a conventional digital to analog converter 78. Analog position command signals are provided on lines 80 to other components of the controller for providing a vector position command signal 82.

These position command signals are filtered (Block 84) and amplified (Block 86) and control DC motor 88. A conventional tachometer generator 90 provides rotational feedback signals which are summed and with filter 84. Also shown in FIG. 4 is conventional power supply 92. If an out of limit position is selected, limit switch 94 disables power to the motor amplifier via switch 96.

Position command signals are further received at galvanometer driver 98 which generates signals for corresponding galvanometer 100 which will rotate the plate and displace the beam accordingly and eliminate the positional error. As described hereinabove each laser interferometer continuously monitors, in real time, the actual position of the optical beam on the write platen surface. The difference between the measured and commanded X and Y positions is converted to an analog voltage with appropriate gain to drive the respective galvanometer. It is preferable that the galvanometer be a limited angle, fast response torque motor. The large mechanical write platen mass limits the frequency band of the displacement error to well within the frequency response of the galvanometer.

Similarly, although the invention has been described hereinabove with respect to a preferred embodiment, those skilled in the art will note that certain additions, deletions and substitutions thereto can be made therein within the spirit and scope of the invention.

I claim:

1. In an optical photoplotter, an apparatus compensating for displacement error from a commanded position of an optical beam generated by an optical exposure head that is incident on a displaceable optical table forming an image, said apparatus comprising:

optical beam feedback means for providing signals indicative of the image position on a surface of the optical table;

control means, receiving said optical beam feedback signals and position signals, for comparing the measured image position with a commanded image position to determine a displacement error and for providing an optical beam control signal related to said displacement error; and compensation means, receiving said control signal and the optical beam from the exposure head for optically displacing said image along said table surface in response to said optical signal to remove said displacement error.

2. The apparatus of claim 1 wherein said optical compensation means comprises a moveable aperture plane.

3. The apparatus of claim 1 wherein said optical compensation means comprises a displaceable objective lens.

4. The apparatus of claim 1 wherein said optical compensation means comprises a tiltable mirror.

5. The apparatus of claim 1 wherein said optical image feedback means comprises a laser interferometer.

6. The apparatus of claim 1 wherein said optical compensation means comprises first and second tiltable mirrors rotatable about adjacent, respective perpendicular axes.

7. In an optical photoplotter, a system for positioning an image formed by an optical beam on an optical table surface, said system comprising:

optical exposure head having an addressable shutter, for selectively providing an optical beam;

an optical beam feedback means for providing signals indicative of image position on the table surface;

means for displacing said optical table in response to position command signals;

compensation means receiving control signals and said optical beam from said optical exposure head for optically displacing said image along said table surface; and control means receiving said optical image feedback signals, for providing said position command signals to displace said optical table, and for measuring optical image position on said table surface, comparing the commanded image position to said measured image position to determine a displacement error, and providing said control signals to said optical compensation means to remove said displacement error.

8. The system of claim 8 wherein said optical compensation means comprises a moveable aperture plane.

9. The system of claim 8 wherein said optical compensation means comprises a displaceable objective lens.

10. The system of claim 8 wherein said optical compensation means comprises a tiltable mirror.

11. The system of claim 8 wherein said optical feedback means comprises a laser interferometer.

12. The system of claim 8 wherein said optical compensation means comprises first and second tiltable mirrors rotatable about adjacent respective perpendicular axes.

13. In an optical photoplotter, a method of compensating for displacement error from a commanded position of an image formed by an optical beam generated by an optical exposure head that is incident on a displaceable optical table, said method comprising the steps of:

generating optical beam feedback signals indicative of the image position on a surface of the optical table;

comparing the measured image position with a commanded position to determine a displacement error; and optically displacing the image along said table surface to remove the displacement error after the optical beam has been provided from the optical exposure head.

* * * * *

UNITED STATES PATENT AND TRADEMARK OFFICE
CERTIFICATE OF CORRECTION

PATENT NO. : 4,851,656

DATED : July 25, 1989

INVENTOR(S) : Straayer

It is certified that error appears in the above-identified patent and that said Letters Patent is hereby corrected as shown below:

Column 1

Line 26, delete "PCB" and substitute--printed circuit board--.

Column 2

Line 61, after "41" insert--,--.

Column 3

Line 56, delete "fig.5" and substitute--Fig. 5--.

Column 4

Line 23, after "effect" insert--of--.
Line 61, delete "Block" and substitute--block--.
Line 62, delete "Block" and substitute--block--.

Column 6

Line 25, delete "8" and substitute--7--.
Line 27, delete "8" and substitute--7--.
Line 30, delete "8" and substitute--7--.
Line 32, delete "8" and substitute--7--.

UNITED STATES PATENT AND TRADEMARK OFFICE
CERTIFICATE OF CORRECTION

PATENT NO. : 4,851,656

DATED : July 25, 1989

INVENTOR(S) : Straayer

It is certified that error appears in the above-identified patent and that said Letters Patent is hereby corrected as shown below:

Column 6

Line 34, delete "8" and substitute --7--.

Signed and Sealed this

Twelfth Day of June, 1990

*Attest:*

HARRY F. MANBECK, JR.

*Attesting Officer*     *Commissioner of Patents and Trademarks*